(12) United States Patent
Kim et al.

(10) Patent No.: US 12,302,735 B2
(45) Date of Patent: May 13, 2025

(54) DISPLAY DEVICE AND METHOD OF MANUFACTURING THE SAME

(71) Applicant: SAMSUNG DISPLAY CO., LTD., Yongin-si (KR)

(72) Inventors: Youn Joon Kim, Seoul (KR); Bokwang Song, Hwaseong-si (KR); Jungwoo Park, Seoul (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 265 days.

(21) Appl. No.: 17/207,683

(22) Filed: Mar. 21, 2021

(65) Prior Publication Data
US 2022/0028940 A1 Jan. 27, 2022

(30) Foreign Application Priority Data
Jul. 22, 2020 (KR) .................. 10-2020-0090883

(51) Int. Cl.
*H10K 59/50* (2023.01)
*B60K 35/60* (2024.01)
(Continued)

(52) U.S. Cl.
CPC ............. *H10K 59/50* (2023.02); *B60K 35/60* (2024.01); *G02B 5/0257* (2013.01);
(Continued)

(58) Field of Classification Search
CPC .... H10K 50/844; H10K 50/85; H10K 50/865; H10K 50/86; H10K 59/40; H10K 59/87;
(Continued)

(56) References Cited

U.S. PATENT DOCUMENTS 8,026,880 B2    9/2011   Mimura et al.
8,213,082 B2    7/2012   Gaides et al.
(Continued)

FOREIGN PATENT DOCUMENTS

JP          4601360      12/2010
KR       10-0921483      10/2009
(Continued)

OTHER PUBLICATIONS

Translation to English for KR 20160083609 A via espacenet. accessed May 12, 2023 (Year: 2016).*

*Primary Examiner* — Zachary M Davis
(74) *Attorney, Agent, or Firm* — F. CHAU & ASSOCIATES, LLC

(57) ABSTRACT

A display device includes a display panel, an optical layer disposed on the display panel, a window disposed on the optical layer, and a light control layer. The light control layer is disposed between the display panel and the optical layer or between the optical layer and the window. The light control layer includes a plurality of transmission portions spaced apart from each other and a light blocking portion filled between the transmission portions. A thickness of each of the transmission portions and a width of each of the transmission portions in a cross-section are determined by a function of a refractive index of the transmission portions, and an exit angle of light emitted from the display panel and propagating through the light control layer.

16 Claims, 15 Drawing Sheets

(51) Int. Cl.
*G02B 5/02* (2006.01)
*H10K 50/86* (2023.01)
*B60K 35/22* (2024.01)
*B60K 35/40* (2024.01)

(52) U.S. Cl.
CPC ......... *G02B 5/0294* (2013.01); *H10K 50/865* (2023.02); *B60K 35/22* (2024.01); *B60K 35/425* (2024.01); *B60K 2360/1523* (2024.01)

(58) Field of Classification Search
CPC ........ H10K 59/50; H10K 71/00; H10K 50/80; G02B 2027/0123; G02B 5/201; G02B 5/223; G02B 5/0257; G02B 5/0294; G02B 27/0101; G02B 5/20; B60K 2370/1523; B60K 2370/39; B60K 35/00; B60K 2370/25
See application file for complete search history.

(56) References Cited

U.S. PATENT DOCUMENTS

| | | | |
|---|---|---|---|
| 9,678,379 | B2 | 6/2017 | Hong et al. |
| 10,903,284 | B2 | 1/2021 | Lee et al. |
| 2010/0271721 | A1* | 10/2010 | Gaides .................. G02B 5/045 359/885 |
| 2019/0346615 | A1 | 11/2019 | Johnson et al. |
| 2021/0333624 | A1* | 10/2021 | Schmidt ............ G02F 1/133524 |

FOREIGN PATENT DOCUMENTS

| | | | |
|---|---|---|---|
| KR | 10-2010-0100952 A | | 9/2010 |
| KR | 20160083609 A | * | 2/2016 |
| KR | 10-1678649 | | 11/2016 |
| KR | 10-2018-0133024 A | | 12/2018 |
| KR | 10-2019-0054484 | | 5/2019 |
| KR | 10-2019-0099304 | | 8/2019 |

* cited by examiner

DISPLAY DEVICE AND METHOD OF MANUFACTURING THE SAME

CROSS-REFERENCE TO RELATED APPLICATION

This U.S. non-provisional patent application claims priority under 35 U.S.C. § 119 from Korean Patent Application No. 10-2020-0090883, filed on Jul. 22, 2020 in the Korean Intellectual Property Office, the contents of which are herein incorporated by reference in their entirety.

BACKGROUND

1. Technical Field

The present disclosure is directed to a display device and a method of manufacturing the same. More particularly, embodiments of the present disclosure are directed to a display device that includes a light control layer and a method of manufacturing the display device.

2. Discussion of Related Art

Vehicles have become more than simple transportation devices, and are now being equipped with various display devices. Drivers can obtain various information such as a current state of the vehicle as well as real-time traffic information through these display devices.

However, when light emitted from the display device is reflected by a vehicle's windshield, the reflected light can obstruct a driver's vision. In response, to prevent a driver's vision from being obstructed, a light control film that limits an exit angle of the light emitted from the display device can be used.

SUMMARY

Embodiments of the present disclosure provide a display device that includes a light control layer that includes a transmission portion with reduced thickness and a light blocking portion with reduced width.

Embodiments of the present disclosure provide a method of manufacturing a display device that includes a light control layer that includes a transmission portion and a light blocking portion.

Embodiments of the inventive concept provide a display device that includes a display panel, an optical layer disposed on the display panel, a window disposed on the optical layer, and a light control layer disposed between the display panel and the optical layer or between the optical layer and the window. The light control layer includes a plurality of transmission portions spaced apart from each other and a light blocking portion disposed between the transmission portions. A thickness (T0) of each of the transmission portions and a width (S0) of each of the transmission portions in a cross-section are determined by a function of $$\frac{T0}{S0} = \sqrt{\left(\frac{n}{\sin\theta}\right)^2 - 1},$$

wherein n is a refractive index of the transmission portions, and θ is an exit angle of a light emitted from the display panel and propagating through the light control layer.

The refractive index of the transmission portions is equal to or greater than about 1.4 and equal to or less than about 1.7.

The exit angle is equal to or greater than about 30° and equal to or less than about 50°.

The display device further includes an input sensing layer disposed on the display panel, and the display panel, the input sensing layer, the light control layer, the optical layer, and the window are sequentially stacked.

The display device further includes a first adhesive layer disposed between the light control layer and the optical layer, and the light control layer and the optical layer are spaced apart from each other with the first adhesive layer interposed therebetween.

The display device further includes an auxiliary layer disposed on or under the light control layer, and the auxiliary layer includes a polyimide resin or a glass.

The display device further includes a second adhesive layer disposed between the optical layer and the auxiliary layer, and the auxiliary layer and the optical layer are spaced apart from each other with the second adhesive layer interposed therebetween.

The light control layer is disposed between the display panel and the optical layer, the auxiliary layer includes glass, and the glass is optically isotropic.

The light control layer is disposed between the optical layer and the window, the auxiliary layer includes polyimide resin, and the polyimide resin is optically anisotropic.

The display device further includes a film layer that includes a cyclo-olefin polymer, and the film layer, the auxiliary layer, and the light control layer are sequentially stacked.

The thickness in the cross-section of the transmission portions is greater than 0 um and equal to or less than about 30 um.

A width in the cross-section of the light blocking portion is greater than 0 um and equal to or less than about 2 um.

The display panel is one of an organic light emitting display panel or a quantum dot light emitting display panel.

Embodiments of the inventive concept provide a method of manufacturing a display device. The manufacturing method of the display device includes the steps of providing an optical layer on a display panel, providing a window on the optical layer, and providing a light control layer between the display panel and the optical layer or between the optical layer and the window. The step of providing the light control layer includes coating an inorganic material on a preliminary transmission portion, etching the inorganic material to form a mask, etching the preliminary transmission portion to form a plurality of transmission portions spaced apart from each other, forming a preliminary light blocking portion on the mask to and between the transmission portions, and removing the mask where a light blocking portion is formed. A thickness of each of the transmission portions and a width of each of the transmission portions in a cross-section are determined by a function of $$\frac{T0}{S0} = \sqrt{\left(\frac{n}{\sin\theta}\right)^2 - 1},$$

wherein T0 is a n is a refractive index of the transmission portions, and θ is an exit angle of a light emitted from the display panel and propagating through the light control layer.

The preliminary transmission portion is formed on one of an auxiliary layer or an input sensing layer, the auxiliary layer is disposed under the light control layer or on the light control layer, and the input sensing layer is disposed on the display panel.

The auxiliary layer includes a polyimide resin or a glass.

When the preliminary transmission portion is formed on the input sensing layer, the light control layer is formed between the display panel and the optical layer.

When the preliminary transmission portion is formed on the auxiliary layer, the light control layer is formed between the display panel and the optical layer or between the optical layer and the window.

The mask is removed by a dry etching method.

Embodiments of the inventive concept provide a display device that includes a display panel; and a light control layer disposed on the display panel. The light control layer includes a plurality of transmission portions spaced apart from each other and a light blocking portion between the transmission portions. A ratio of a thickness of each of the transmission portions and a width of each of the transmission portions in a cross-section is a function of a refractive index of the transmission portions and an exit angle of light emitted from the display panel and propagating through the light control layer. The refractive index of the transmission portions is equal to or greater than about 1.4 and equal to or less than about 1.7, and the exit angle is equal to or greater than about 30° and equal to or less than about 50°.

The display device further includes an optical layer disposed on the light control layer; and a window disposed on the optical layer.

The display device further includes an optical layer disposed between the display panel and the light control layer; and a window disposed on the light control layer, opposite from the optical layer.

The thickness (T0) of each of the transmission portions and the width (S0) of each of the transmission portions in a cross-section satisfy $$\frac{T0}{S0} = \sqrt{\left(\frac{n}{\sin\theta}\right)^2 - 1},$$

wherein n is the refractive index of the transmission portions, and θ is the exit angle of light emitted from the display panel and propagating through the light control layer.

According to the above, a display device includes a light control layer that has the transmission portion with reduced thickness and a light blocking portion with reduced width, and thus, a display device that is thinner and that has an improved transmittance is provided.

In addition, a method of manufacturing a display device includes a step of forming a light control layer in which the thickness of the transmission portion and the width of the light blocking portion are reduced. Thus, a display device that has improved transmittance is provided.

DETAILED DESCRIPTION

Figure 1:
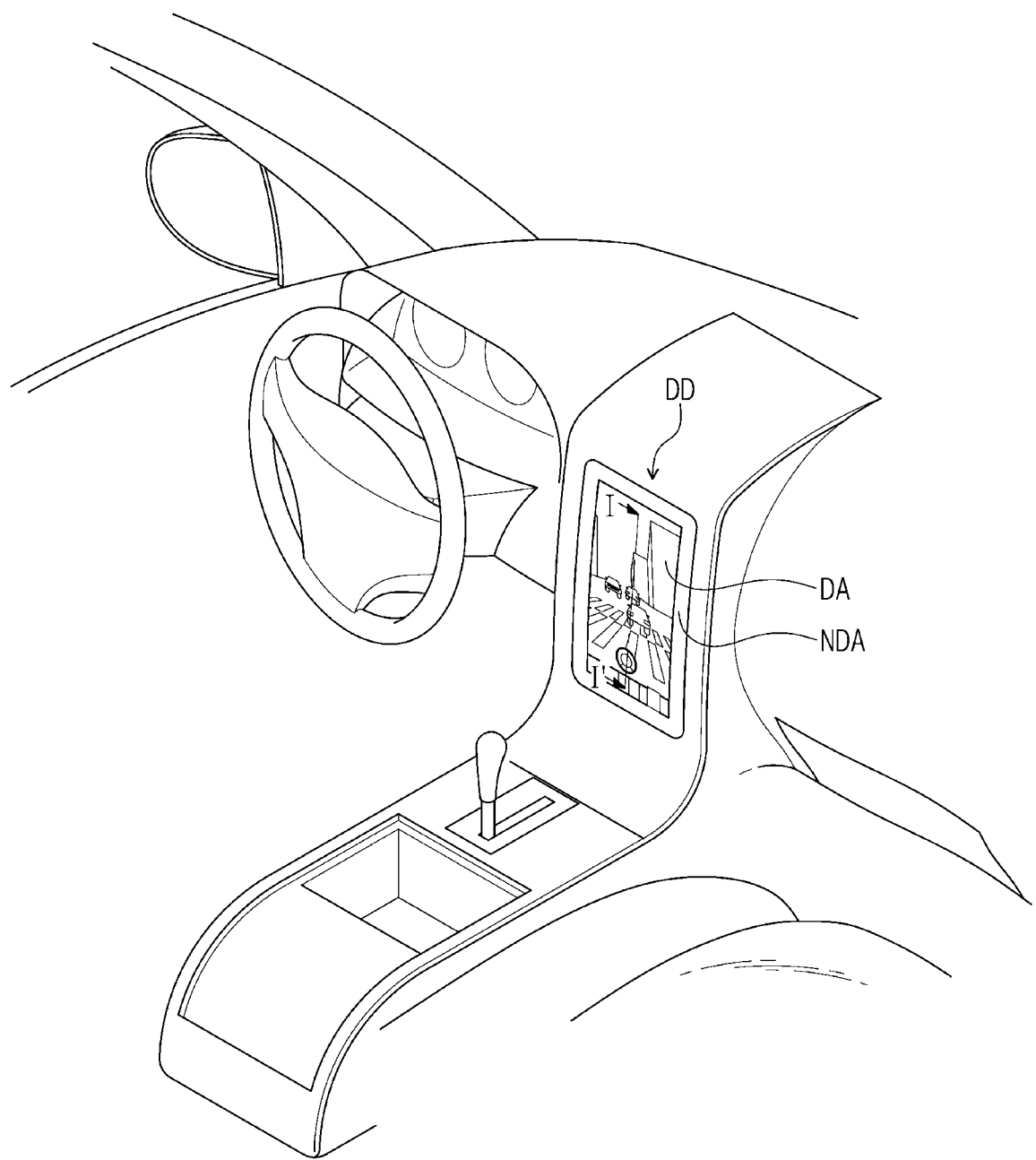
FIG. 1 is a perspective view of a display device according to an exemplary embodiment of the present disclosure.
Figure 1:
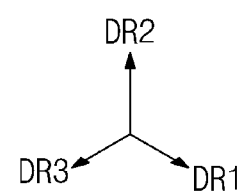

Embodiments of the present disclosure may be variously modified and realized in many different forms, and thus exemplary embodiments will be illustrated in the drawings and described in detail hereinbelow. However, embodiments of the present disclosure should not be limited to exemplary embodiments, and should be construed to include all modifications, equivalents, or replacements included in the spirit and scope of the present disclosure.

In the present disclosure, it will be understood that when an element or layer is referred to as being "on", "connected to" or "coupled to" another element or layer, it can be directly on, connected or coupled to the other element or layer or intervening elements or layers may be present.

Like numerals may refer to like elements throughout. In the drawings, the thickness, ratio, and dimension of components may be exaggerated for effective description of the technical content.

Herein, when two or more numbers are described as being about equal each other, it is to be understood that the numbers are equal each other to within an experimental measurement error.

Hereinafter, a display device and a method of manufacturing the display device according to an exemplary embodiment of the present disclosure will be described in detail with reference to the accompanying drawings.

FIG. 1 is a perspective view of a display device DD according to an exemplary embodiment of the present disclosure. The display device DD shown in FIG. 1 may be a center information display (CID) for a vehicle. The display device DD can be activated in response to electrical signals. The display device DD can be incorporated into various embodiments. For example, the display device DD can be incorporated into various transportation devices, such as cars, bicycles, motorcycles, ships, airplanes, etc., however, embodiments should not be limited thereto. The display device DD can be used with other transportation devices as long as the display device does not depart from inventive concepts of the present disclosure.

According to an embodiment, the display device DD includes a display area DA and a non-display area NDA. An image is displayed through the display area DA. FIG. 1 shows a traffic situation as an example of an image in the display area DA. The image is not displayed through the non-display area NDA. The display area DA is substantially parallel to a plane defined by a first directional axis DR1 and a second directional axis DR2 that crosses the first directional axis DR1.

Upper (or front) and lower (or rear) surfaces of each member are defined with respect to a direction in which the image is displayed. The upper and lower surfaces face each other in a third directional axis DR3, and a normal line direction of each of the upper and lower surfaces is substantially parallel to the third directional axis DR3. In addition, directions indicated by the first, second, and third directional axes DR1, DR2, and DR3 are relative to each other and can be changed to other directions. Hereinafter, first, second, and third directions respectively correspond to the directions indicated by the first, second, and third directional axes DR1, DR2, and DR3 and are assigned with the same reference numerals as those of the first, second, and third directional axes DR1, DR2, and DR3.

Figure 2:
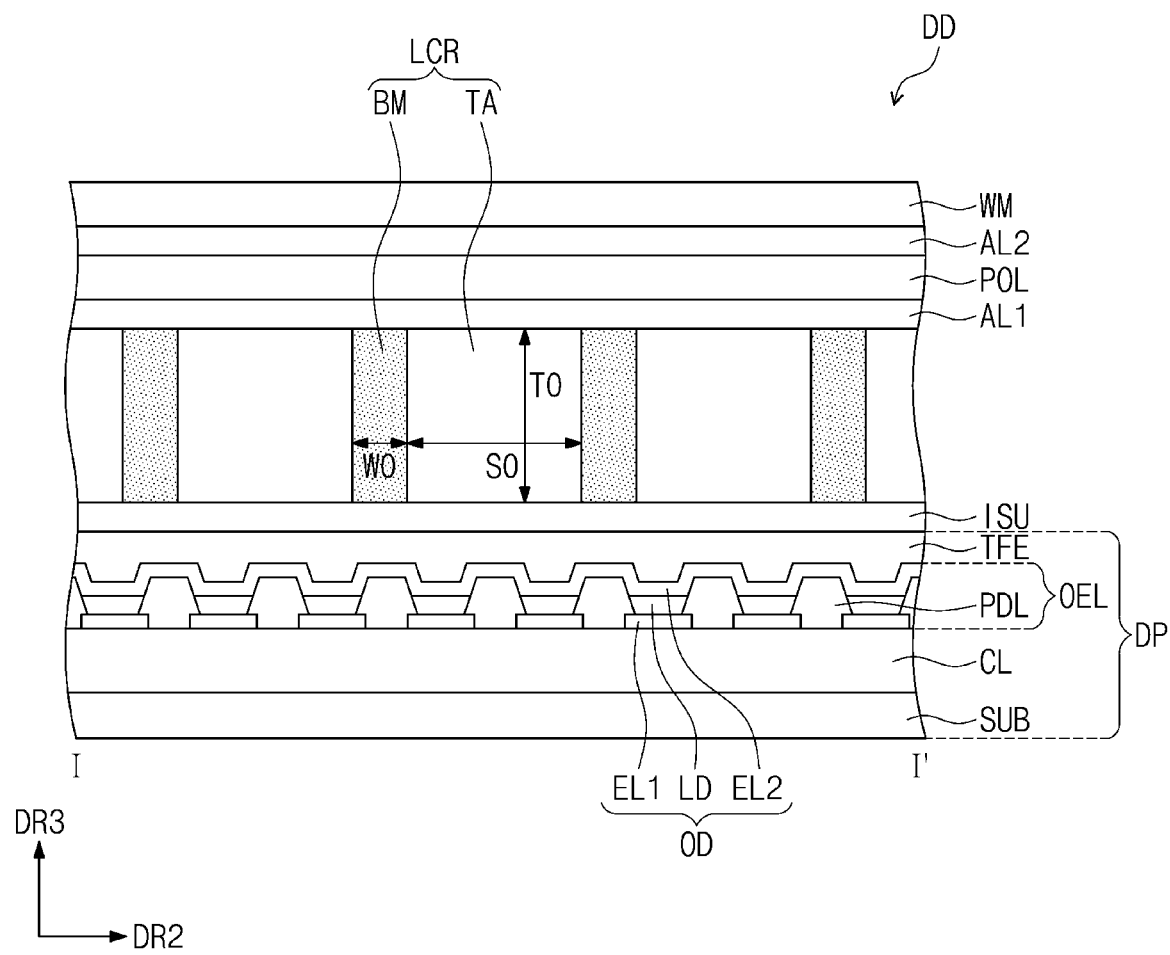
FIG. 2 is a cross-sectional view taken along a line I-I' of FIG. 1.
Figure 3:
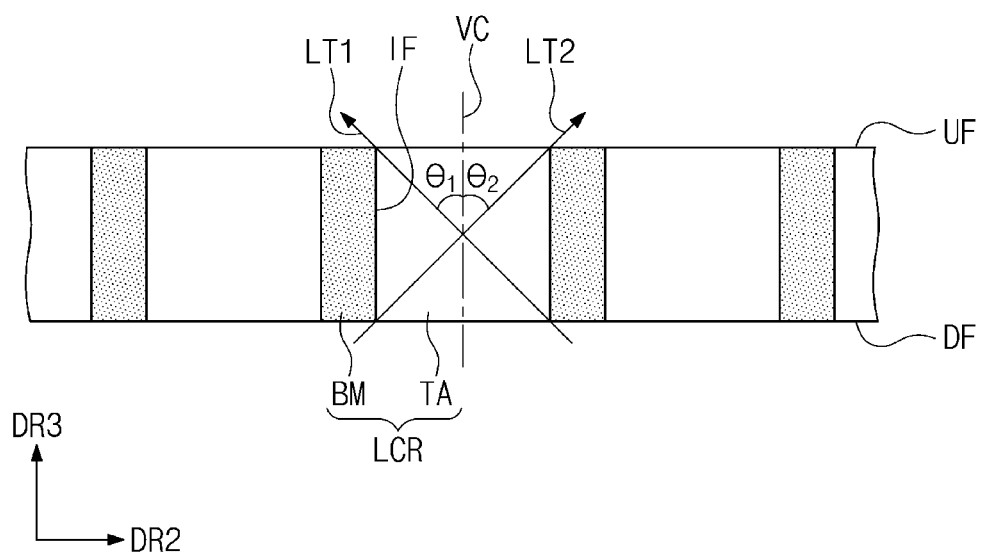
FIG. 3 is a cross-sectional view of a light control layer according to an exemplary embodiment of the present disclosure.

FIG. 2 is a cross-sectional view taken along a line I-I' of FIG. 1, FIG. 3 is a cross-sectional view of a light control layer LCR according to an exemplary embodiment of the present disclosure, and FIGS. 4 to 7 are cross-sectional views of display devices according to exemplary embodiments of the present disclosure.

According to an embodiment, the display devices DD, DD-a, DD-b, DD-c, DD-d include display panels DP and DP-a, an optical layer POL disposed on the display panels DP and DP-a, a window WM disposed on the optical layer POL, and a light control layer LCR between the display panels DP and DP-a and optical layer POL. The light control layer LCR according to an exemplary embodiment includes a plurality of transmission portions TA spaced apart from each other and light blocking portions BM that fill the spaces between the transmission portions TA. When viewed in a cross-section, a ratio of a thickness T0 of the transmission portion TA to a width S0 of the transmission portion TA is a function of a refractive index of the transmission portion TA and an exit angle of a light emitted from the display panels DP and DP-a and incident into the light control layer LCR, as expressed in the following Equation 1. The width S0 of the transmission portion TA is defined by the separation of the light blocking portions BM. When viewed in a cross-section, the width S0 of the transmission portion TA and the thickness T0 of the transmission portion TA are respectively measured in directions substantially perpendicular to each other. In a cross-section defined by the second directional axis DR2 and the third directional axis DR3, the width S0 of the transmission portion TA is substantially parallel to the second directional axis DR2, and the thickness T0 of the transmission portion TA is substantially parallel to the third directional axis DR3.

$$\frac{T0}{S0} = \sqrt{\left(\frac{n}{\sin\theta}\right)^2 - 1} \qquad \text{Equation 1}$$

In Equation 1, n denotes the refractive index of the transmission portion TA, and θ denotes the exit angle of a light emitted from the display panels DP and DP-a and incident into the light control layer LCR. Equation 1 and the light control layer LCR will be described in detail below.

Figure 4:
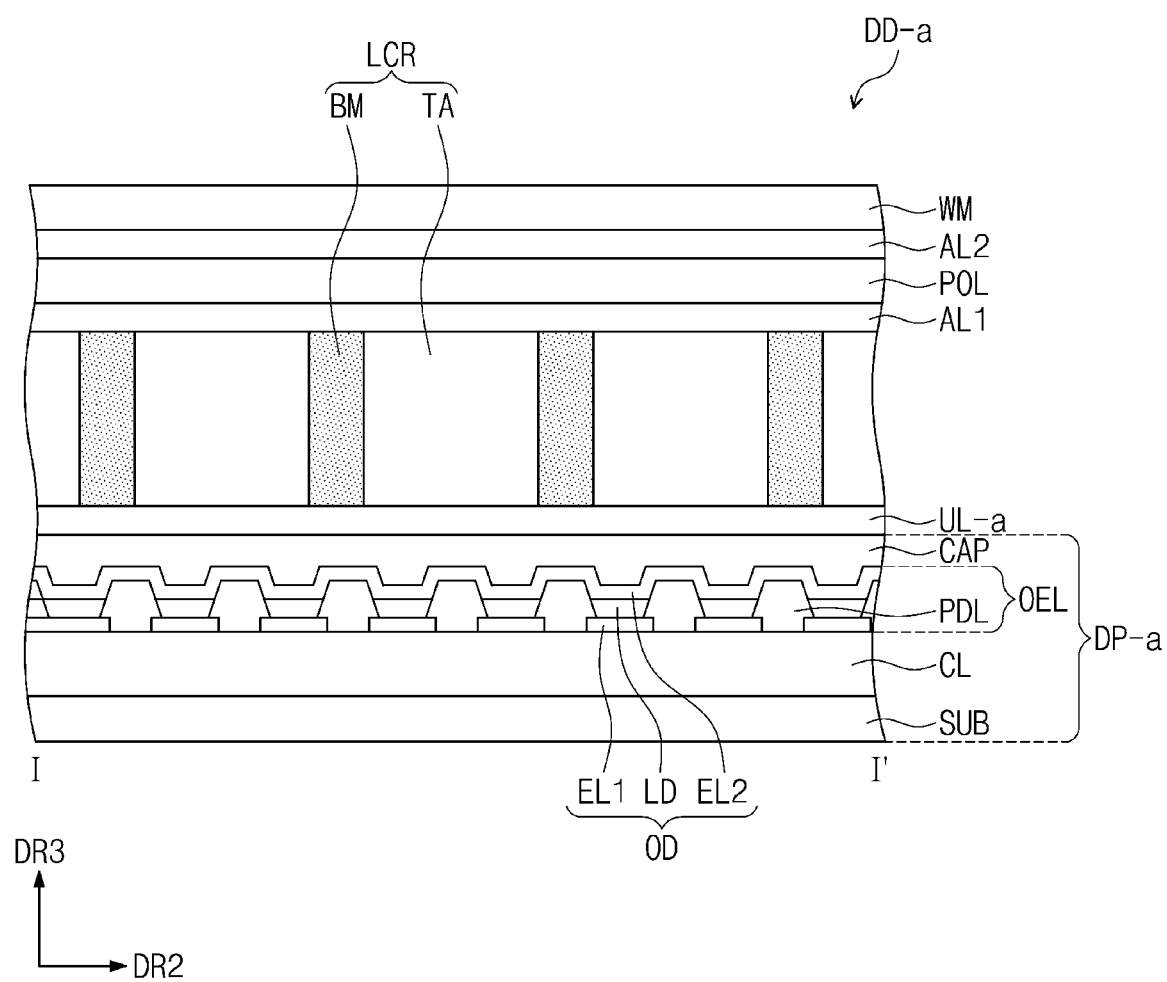
FIG. 4 is a cross-sectional view of a portion of a display device according to an exemplary embodiment of the present disclosure.
Figure 5:
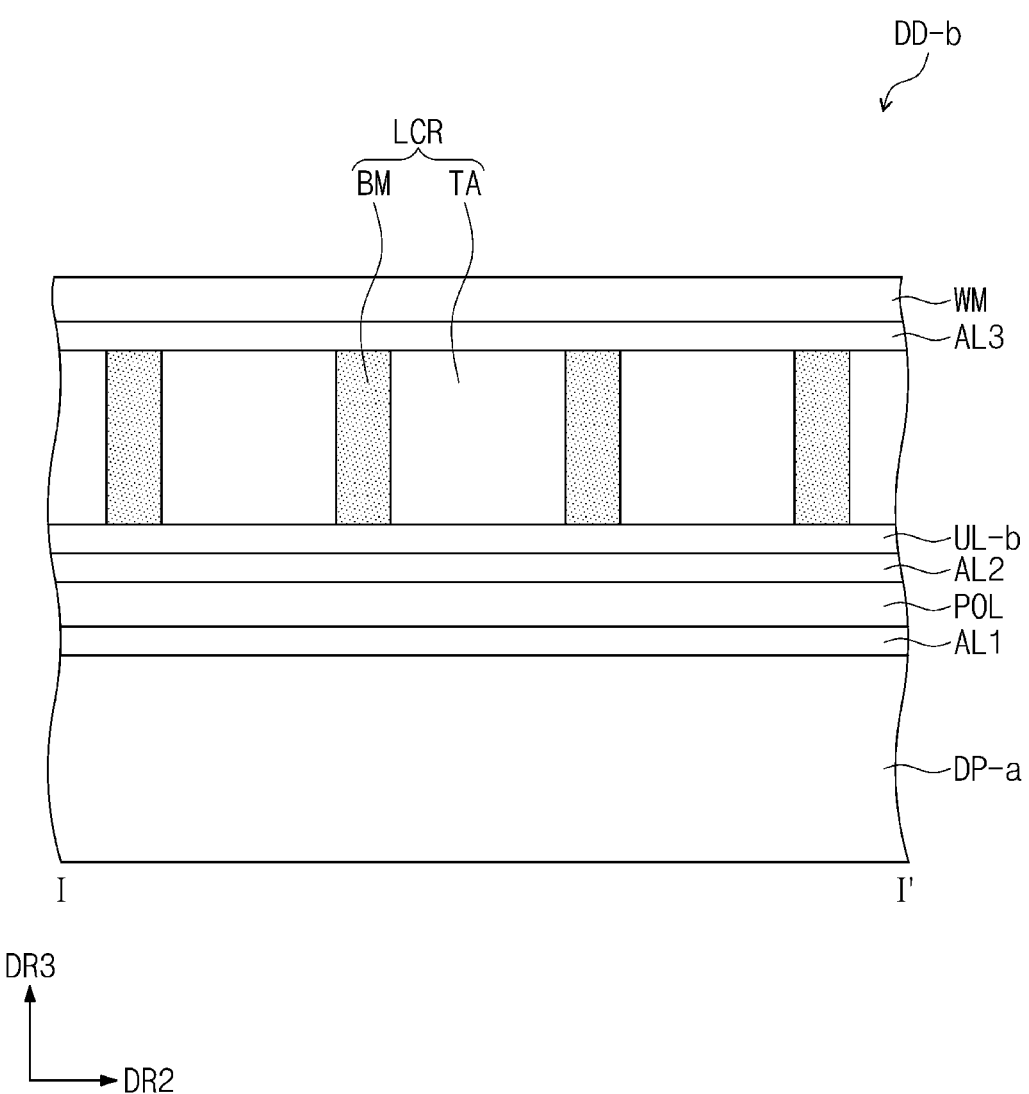
FIG. 5 is a cross-sectional view of a portion of a display device according to an exemplary embodiment of the present disclosure.
Figure 6:
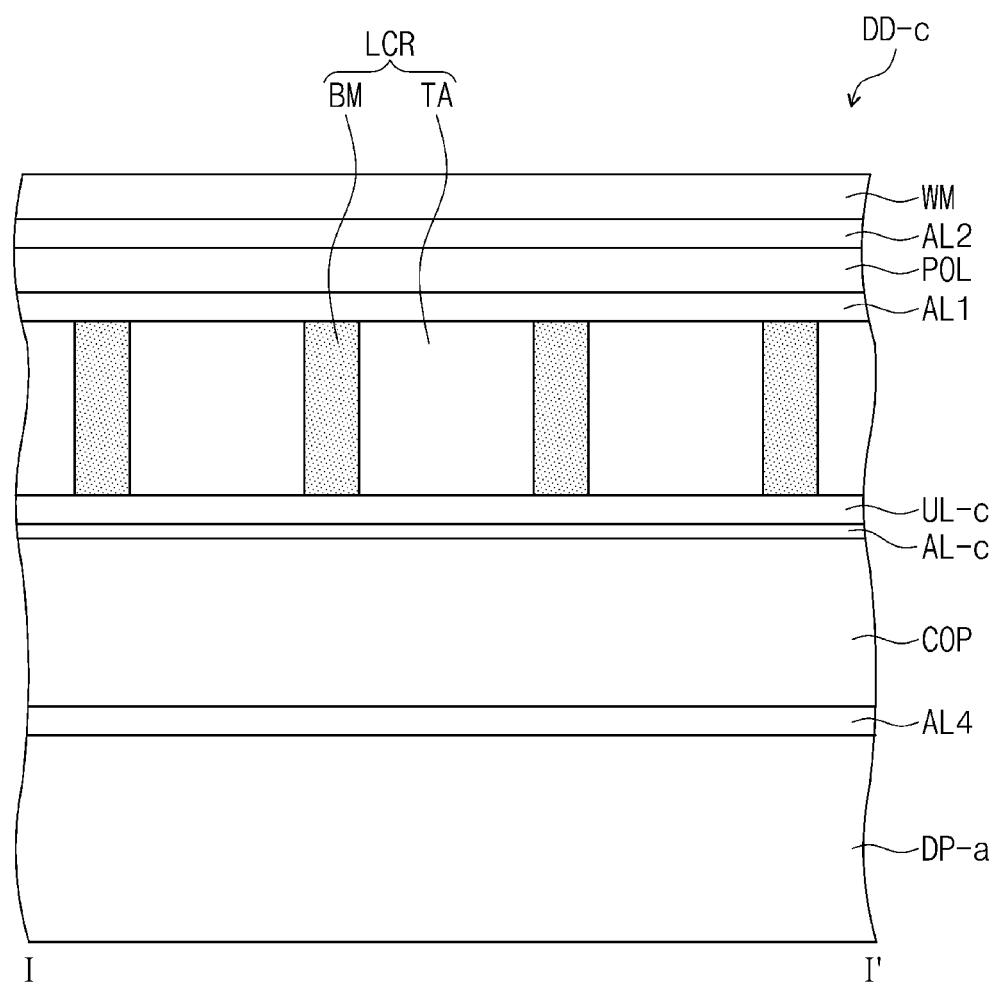
FIG. 6 is a cross-sectional view of a portion of a display device according to an exemplary embodiment of the present disclosure.
Figure 7:
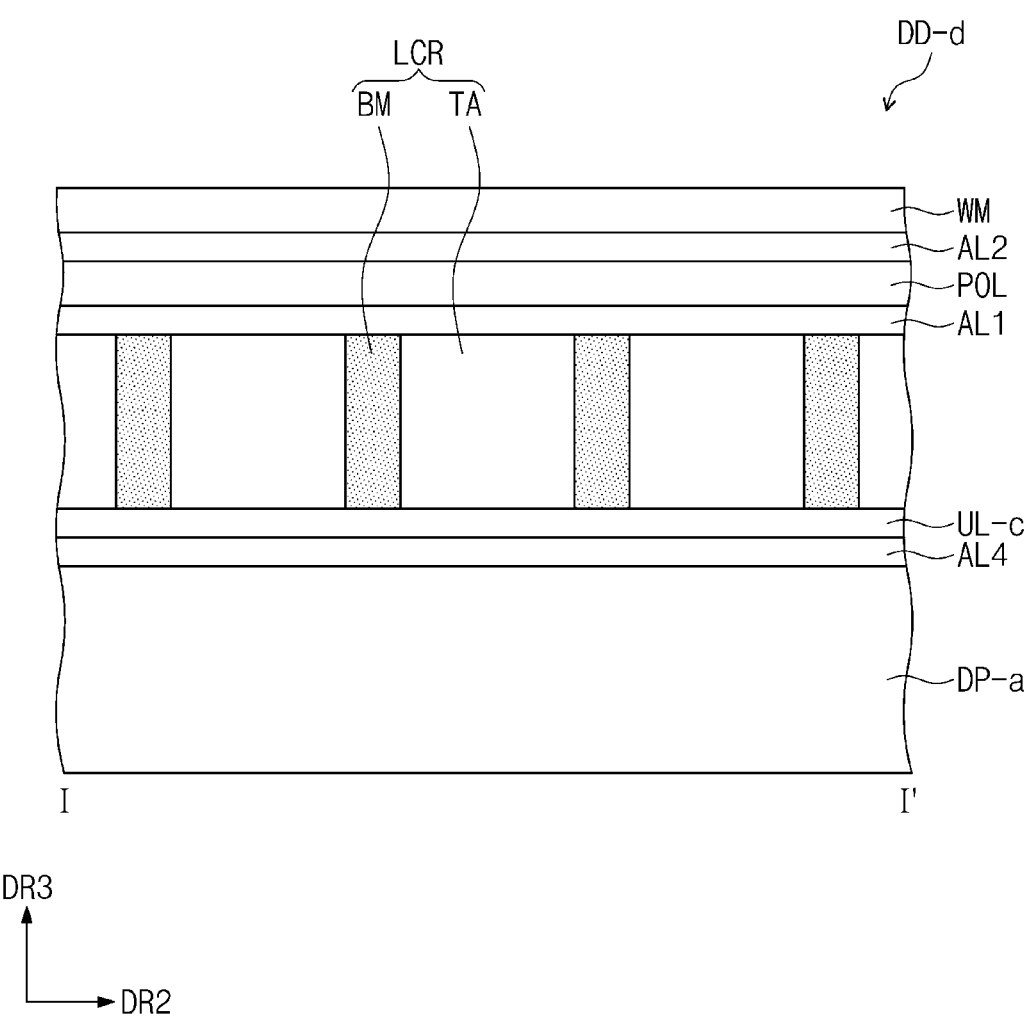
FIG. 7 is a cross-sectional view of a portion of a display device according to an exemplary embodiment of the present disclosure.

Referring to FIG. 2, according to an embodiment, the display panel DP includes a base layer SUB, a circuit layer CL, a display element layer OEL, and an encapsulation layer TFE. FIG. 4 shows the display panel DP-a as including a capping layer CAP instead of the encapsulation layer TFE. FIGS. 5 to 7 respectively show display devices DD-b DD-c, and DD-d that each include a display panel DP-a that has the same components as the display panel DP-a shown in FIG. 4. According to an exemplary embodiment, each of the display panels DP and DP-a may be an organic light emitting display panel or a quantum dot display panel. A light emitting layer of an organic light emitting display panel includes an organic light emitting material. A light emitting layer of a quantum dot light emitting display panel includes quantum dots. However, these are merely exemplary, and embodiments of the display panels DP and DP-a are not limited thereto.

According to an embodiment, the base layer SUB may be a polymer substrate, a plastic substrate, a glass substrate, or a quartz substrate. The base layer SUB is a transparent insulating substrate. The base layer SUB may be rigid or flexible.

According to an embodiment, the circuit layer CL is disposed on the base layer SUB. The circuit layer CL includes a plurality of transistors. Each of the transistors include a control electrode, an input electrode, and an output electrode. For example, the circuit layer CL includes a switching transistor and a driving transistor that drive a light emitting element OD.

According to an embodiment, the display element layer OEL includes a plurality of light emitting elements OD. Each of the light emitting elements OD includes a first electrode EL1, a functional layer LD, and a second electrode EL2, which are sequentially stacked. The functional layer LD includes a hole transport region, a light emitting layer, and an electron transport region, which are sequentially stacked. The light emitting elements OD emit light in different wavelength ranges. Alternatively, the light emitting elements OD emit light in the same wavelength range.

According to an embodiment, a pixel definition layer PDL is disposed within the display element layer OEL. The pixel definition layer PDL may include an organic material. For example, the pixel definition layer PDL may include a polyacrylate-based resin or a polyimide-based resin. Alternatively, the pixel definition layer PDL may include an inorganic material. For example, the pixel definition layer PDL may include silicon nitride, silicon oxide, or silicon oxynitride. The first electrodes EL1 and functional layers LD of the light emitting elements OD of the display element layer OEL are separated from each other by the pixel definition layer PDL.

According to an embodiment, the encapsulation layer TFE is disposed on the display element layer OEL and encapsulates the display element layer OEL. The encapsulation layer TFE protects the display element layer OEL from moisture, oxygen and foreign substances, such as dust particles. The encapsulation layer TFE includes at least one inorganic layer and at least one organic layer. The encapsulation layer TFE has a structure in which an organic layer and an inorganic layer are alternately stacked with each other. For example, the encapsulation layer TFE has a structure in which an inorganic layer, an organic layer, and an inorganic layer are sequentially stacked.

According to an embodiment, the display device DD further includes an input sensing layer ISU disposed on the display panel DP and under the light control layer LCR. The input sensing layer ISU can sense an external input applied thereto. The external inputs may be provided in a variety of ways. For example, the external inputs may be in the form of a user's body, a stylus pen, light, heat, pressure, etc. In addition, the external inputs may include a proximity input, such as hovering, applied when approaching close to or adjacent to a target surface as well as a touch input from a user's body, such as a user's hand.

According to an embodiment, the input sensing layer ISU is disposed directly on the encapsulation layer TFE. The light control layer LCR, the optical layer POL, and the window WM are disposed on the input sensing layer ISU. The display device DD includes the display panel DP, the input sensing layer ISU, the light control layer LCR, the optical layer POL, and the window WM, which are sequentially disposed. The light control layer LCR is disposed directly on the input sensing layer ISU. When the light control layer LCR is disposed directly on the input sensing layer ISU, the light control layer LCR is disposed between the display panel DP and the optical layer POL. In a manufacturing method of the display device described below, the light control layer LCR is formed directly on the input sensing layer ISU. The light control layer LCR is formed on the input sensing layer ISU through a successive process.

According to an exemplary embodiment, the light control layer LCR is disposed between the optical layer POL and the display panels DP and DP-a or between the optical layer POL and the window WM. The light control layer LCR includes transmission portions TA and light blocking portions BM. The transmission portions TA are spaced apart from each other in the second directional axis DR2 when viewed in a cross-section defined by the second directional axis DR2 and the third directional axis DR3. Spaces between the transmission portions TA are filled with the light blocking portion BM.

According to an exemplary embodiment, when viewed in a cross-section defined by the second directional axis DR2 and the third directional axis DR3, the thickness T0 of the transmission portion TA in the third direction DR3 is greater than about 0 um and equal to or smaller than about 30 um. The width W0 of the light blocking portion BM in the second directional axis DR2 is greater than about 0 um and equal to or less than about 2 um. When the width W0 of the light blocking portion is greater than about 2 um, a light transmittance of the light control layer may be reduced. When the width W0 of the light blocking portion is 0 um, i.e., when no light blocking portion is present, the light control layer might not be able to limit the exit angle. For example, the thickness T0 of the transmission portion TA may be equal to or greater than about 10 um and equal to or less than about 30 um. The width W0 of the light blocking portion BM may be equal to or greater than about 1 um and equal to or less than about 2 um. However, these ranges are merely exemplary, and embodiments should not be limited thereto.

According to an exemplary embodiment, the thickness T0 of the transmission portion TA and the width S0 of the transmission portion TA of the light control layer LCR satisfy the following Equation 1.

$$\frac{T0}{S0} = \sqrt{\left(\frac{n}{\sin\theta}\right)^2 - 1} \qquad \text{Equation 1}$$

In Equation 1, n denotes the refractive index of the transmission portion TA, and θ denotes the exit angle of the light emitted from the display panels DP and DP-a and exiting from the light control layer LCR after passing through the light control layer LCR. The refractive index of the transmission portion TA is equal to or greater than about 1.4 and equal to or less than about 1.7. The exit angle θ of the light exiting from the light control layer LCR after passing through the light control layer LCR is equal to or greater than about 30° and equal to or less than about 50°. That is, n may be equal to or greater than about 1.4 and equal to or less than about 1.7, and θ may be equal to or greater than about 30° and equal to or less than about 50°. For example, the exit angle θ of the light may be equal to or greater than about 40° and equal to or less than about 50°. However, these values are merely exemplary, and embodiments should not be limited thereto.

According to an exemplary embodiment, when the thickness T0 and the width S0 of the transmission portion TA satisfy Equation 1, the thickness T0 of the transmission portion TA can be reduced. In addition, when the thickness T0 and the width S0 of the transmission portion TA satisfy Equation 1, the width W0 of the light blocking portion BM between the transmission portions TA can be reduced.

According to an exemplary embodiment, the light control layer LCR has improved light transmittance since the width W0 of the light blocking portion BM is reduced. As the width of the light blocking portion BM is reduced, an area where the light is absorbed decreases, and the light transmittance is improved. Accordingly, the display devices DD, DD-a, DD-b, DD-c, and DD-d that include the light control layer LCR have improved light transmittance.

According to an exemplary embodiment, the light control layer LCR may transmit or absorb light emitted from the display panel DP. The light blocking portion BM in the light control layer LCR absorbs light emitted from the display element layer OEL. The transmission portions TA in the light control layer LCR transmits light emitted from the display element layer OEL. The transmission portions TA are optically transparent. For example, the transmission portions TA have a transmittance equal to or greater than about 80% in a wavelength range equal to or greater than about 400 nm and equal to or less than about 800 nm. The transmission portions TA includes an acrylic-based resin. The light blocking portion BM includes a black carbon. However, these materials are merely exemplary, and embodiments should not be limited thereto.

According to an exemplary embodiment, the light control layer LCR can transmit or absorb light emitted from the display element layer OEL and limits the exit angle θ of the light. Referring to FIG. 3, when light LT1 and LT2 incident into the light control layer LCR propagates toward an interface IF between the light blocking portion BM and the transmission portion TA, paths of the light LT1 and LT2 are restricted, and the exit angles θ of the light are limited. The exit angles θ of the light are angles $θ_1$ and $θ_2$ between the light LT1 and LT2 and a normal line VC. The normal line VC is an imaginary line that is substantially parallel to the third direction DR3. In addition, the normal line VC is substantially perpendicular to an upper surface UF and a lower surface DF of the light control layer LCR. The upper surface UF and the lower surface DF of the light control layer LCR are spaced apart from each other in the third direction DR3. As the exit angle θ of the light is limited by the light control layer LCR, the image from the display device is prevented from being reflected on a windshield of a vehicle that incorporates the display device. Since the image from the display device is not reflected on the vehicles' windshield, an obstruction of the driver's vision caused by the reflected image can be prevented.

In a conventional display device, light transmittance decreases in a light control layer due to a width of the light blocking portion. The light control layer LCR according to an exemplary embodiment includes the transmission portion TA that satisfies Equation 1 described above, and the width W0 of the light blocking portion BM is determined by setting the width S0 and the thickness T0 of the transmission portion TA. According to the display devices DD, DD-a, DD-b, DD-c, and DD-d that include the light control layer LCR, the width W0 of the light blocking portion BM is greater than about 0 um and equal to or less than about 2 m, and thus, light transmittance is improved.

Referring to FIG. 2 again, according to an exemplary embodiment, a first adhesive layer AL1 is disposed between the light control layer LCR and the optical layer POL. The light control layer LCR and the optical layer POL are spaced apart from each other with the first adhesive layer AL1 interposed therebetween. The light control layer LCR and the optical layer POL are coupled to each other by the first adhesive layer AL1. The window WM is disposed on the optical layer POL. The optical layer POL and the window WM are coupled to each other by a second adhesive layer AL2 interposed therebetween. The first adhesive layer ALA and the second adhesive layer AL2 are respectively disposed on and under the optical layer POL. Components disposed under the optical layer POL are coupled to the optical layer POL by the first adhesive layer AL1. Components disposed on the optical layer POL are coupled to the optical layer POL by the second adhesive layer AL2. Each of the first adhesive layer AL1 and the second adhesive layer AL2 includes a pressure sensitive adhesive (PSA). However, this material is exemplary, and the first adhesive layer AL1 and the second adhesive layer AL2 may include other adhesives that are optically transparent.

Referring to FIG. 4, according to an exemplary embodiment, the display panel DP-a includes a base layer SUB, a circuit layer CL, a display element layer OEL, and a capping layer CAP, which are sequentially stacked. The capping layer CAP is disposed on the display element layer OEL. The capping layer CAP may be a planarization layer or a buffer layer. However, this is merely exemplary, and the capping layer CAP may be omitted from the display devices according to other exemplary embodiments.

According to an exemplary embodiment, one of the auxiliary layers UL-a, UL-b, and UL-c is disposed under the light control layer LCR or on the light control layer LCR. The auxiliary layers UL-a, UL-b, and UL-c may include a polyimide resin or a glass. However, this material is merely exemplary, and in other embodiments, the auxiliary layers UL-a, UL-b, UL-c, and UL-d may include a polymer resin except polycarbonate.

Referring to FIG. 4, according to an exemplary embodiment, the auxiliary layer UL-a is disposed under the light control layer LCR. The display device DD-a includes the display panel DP-a, the auxiliary layer UL-a, the light control layer LCR, an optical layer POL, and a window WM, which are sequentially stacked. In FIG. 4, the auxiliary layer UL-a is disposed directly under the light control layer LCR. Alternatively, the auxiliary layer UL-a is disposed directly on the light control layer LCR in a display device according to an exemplary embodiment.

According to an exemplary embodiment, the auxiliary layer UL-a may include glass, and the glass is optically isotropic. That is, the auxiliary layer UL-a does not exhibit birefringence properties. When the auxiliary layer UL-a includes an optically isotropic glass, the light control layer LCR can be disposed between the display panel DP-a and the optical layer POL. When the auxiliary layer UL-a includes an optically isotropic glass, the auxiliary layer UL-a can be disposed directly on or under the light control layer LCR.

Referring to FIG. 5, according to an exemplary embodiment, the light control layer LCR is disposed between the optical layer POL and the window WM. The auxiliary layer UL-b is disposed under the light control layer LCR. The auxiliary layer UL-b includes a polyimide resin, and the polyimide resin is optically anisotropic. That is, the auxiliary layer UL-b exhibits birefringence. As the auxiliary layer UL-b disposed under the light control layer LCR is optically anisotropic, the light control layer LCR can be disposed on the optical layer POL. FIG. 5 shows a structure in which the auxiliary layer UL-b is disposed directly under the light control layer LCR, however, embodiments are not limited thereto, and the auxiliary layer UL-b can be disposed directly on the light control layer LCR.

According to an embodiment, the polyimide resin is optically transparent. The transmittance of the polyimide resin is equal to or greater than about 95%, and a yellowing degree of the polyimide resin is equal to or greater than about 1 and equal to or less than about 10. In this case, the transmittance of the polyimide resin corresponds to a visible light transmittance.

According to an embodiment, FIG. 5 shows the display panel DP-a, the optical layer POL, the auxiliary layer UL-b, the light control layer LCR, and the window WM of the display device as being sequentially stacked. Adhesive layers AL1, AL2, and AL3 are disposed between the display panel DP-a and the optical layer POL, between the optical layer POL and the auxiliary layer UL-b, and between the light control layer LCR and the window WM, respectively. The display panel DP-a and the optical layer POL are coupled to each other by a first adhesive layer AL1. The optical layer POL and the auxiliary layer UL-b are coupled to each other by a second adhesive layer AL2. The light control layer LCR and the window WM are coupled to each other by a third adhesive layer AL3. Each of the first, second, and third adhesive layers AL1, AL2, and AL3 includes a pressure sensitive adhesive.

Referring to FIG. 6, according to an embodiment, the light control layer LCR is disposed between the optical layer POL and the display panel DP-a, and the auxiliary layer UL-c and a film layer COP are disposed under the light control layer LCR. The display device DD-c includes the display panel DP-a, the film layer COP, the auxiliary layer UL-c, the light control layer LCR, the optical layer POL, and the window WM, which are sequentially stacked. An auxiliary adhesive layer AL-c is disposed between the auxiliary layer UL-c and the film layer COP. The auxiliary layer UL-c and the film layer COP are coupled to each other by the auxiliary adhesive layer AL-c. The auxiliary adhesive layer AL-c can be cured by ultraviolet light.

According to an embodiment, the film layer COP is disposed under the auxiliary layer UL-c. The film layer COP includes a cyclo-olefin polymer. A cyclo-olefin polymer is optically isotropic and does not exhibit birefringence. That is, the film layer COP does not exhibit birefringence. When the film layer COP disposed under the light control layer LCR is not birefringent, the light control layer LCR can be disposed between the display panel DP-a and the optical layer POL. The light control layer LCR is disposed under the optical layer POL.

Referring to FIG. 7, according to an embodiment, the auxiliary layer UL-c is disposed under the light control layer LCR, and the optical layer POL is disposed on the light control layer LCR. Different from FIG. 6, FIG. 7 shows the display device DD-d in which no film layer COP is disposed under the auxiliary layer UL-c. The display device DD-d includes the display panel DP-a, the auxiliary layer UL-c, the light control layer LCR, the optical layer POL, and the window WM, which are sequentially stacked. The first adhesive layer AL1 and the second adhesive layer AL2 are respectively disposed under and on the optical layer POL. That is, the second adhesive layer AL2 is disposed under the window WM. The light control layer LCR and the optical layer POL are coupled to each other by the first adhesive layer AL1. The optical layer POL and the window WM are coupled to each other by the second adhesive layer AL2. The display panel DP-a and the auxiliary layer UL-c are coupled to each other by a fourth adhesive layer AL4.

According to embodiments, the auxiliary layer UL-c shown in FIGS. 6 and 7 can be easily attached and detached in a manufacturing method of a display panel, as described below. The auxiliary layer UL-c shown in FIGS. 6 and 7 includes a polymer resin except polycarbonate.

Figure 8:
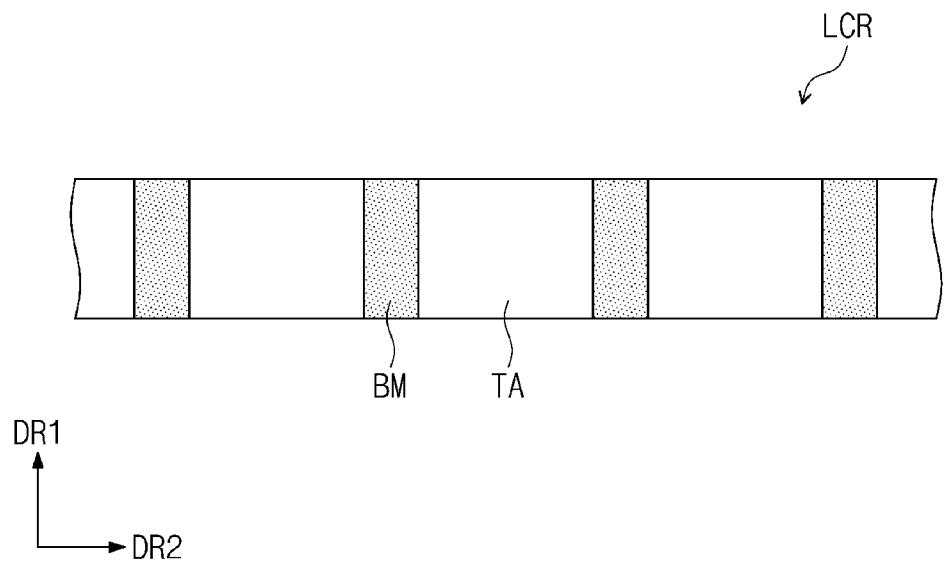
FIG. 8 is a plan view of a light control layer according to an exemplary embodiment of the present disclosure.

FIG. 8 is a plan view showing the light control layer LCR according to an exemplary embodiment. In FIG. 8, each of the transmission portion TA and the light blocking portion BM is illustrated in a rectangular shape including two long sides and two short sides, but the shapes of the transmission portion TA and the light blocking portion BM are not limited thereto. On a plane defined by the first directional axis DR1 and the second directional axis DR2, the light blocking portion BM may be disposed between the transmitting portions TA. On a plane defined by the first directional axis DR1 and the second directional axis DR2, the transmission portion TA and the light blocking portion BM may be alternately disposed. For example, the transmission portion TA and the light blocking portion BM may be alternately arranged in the second directional axis DR2 and extend parallel to the first direction axis DR1.

According to an embodiment, the light control layer LCR includes the transmission portions TA spaced apart from each other and the light blocking portions BM filled in the spaces between the transmission portions TA. The thickness T0 of the transmission portions TA and the width S0 of the transmission portions TA, shown in FIG. 2, satisfy Equation 1 described above, and thus, the width W0 of the light blocking portion BM, shown in FIG. 2, which is determined by the thickness T0 and the width S0 of the transmission portions TA, can be reduced. The light control layer LCR has improved light transmittance due to the reduced width W0 of the light blocking portion BM. The display devices DD, DD-a, DD-b, DD-c, and DD-d according to exemplary embodiments include the light control layer LCR in which the width W0 of the light blocking portion BM is reduced, and thus, have improved light transmittance.

Figure 9:
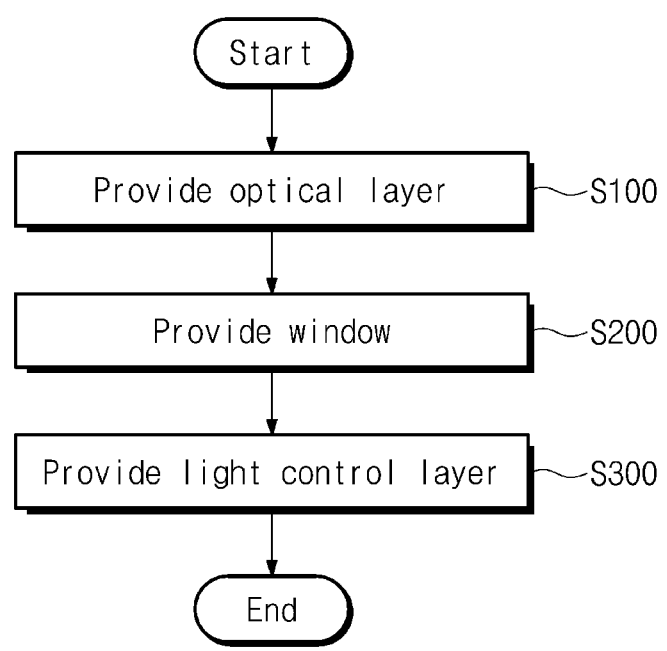
FIG. 9 is a flowchart of a method of manufacturing a display device according to an exemplary embodiment of the present disclosure.
Figure 10:
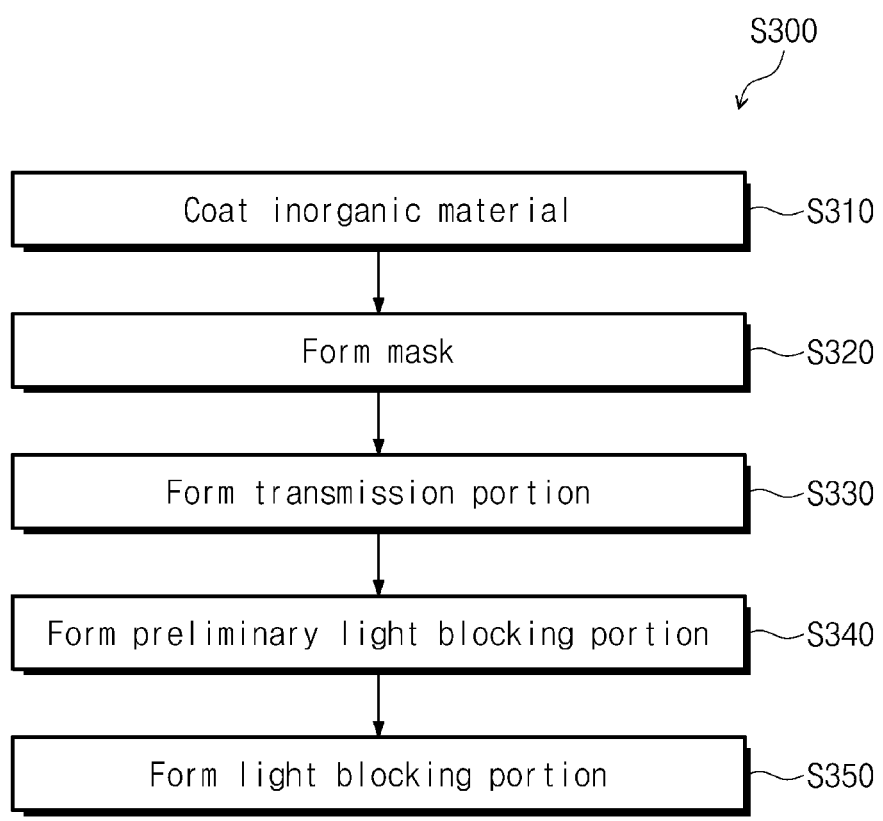
FIG. 10 is a flowchart of a method of manufacturing a display device according to an exemplary embodiment of the present disclosure.

FIGS. 9 and 10 are flowcharts showing a method of manufacturing a display device according to an exemplary embodiment of the present disclosure. FIGS. 11 to 15 illustrate the manufacturing method of a display device according to an exemplary embodiment of the present disclosure. In FIGS. 11 to 15, the same reference numerals denote the same elements as shown in FIGS. 2 to 7, and thus, detailed descriptions of the same elements will be omitted.

A manufacturing method of a display device according to an exemplary embodiment includes providing an optical layer (S100), providing an window on the optical layer (S200), and providing a light control layer (S300). Providing the light control layer (S300) further includes coating an inorganic material (S310), forming a mask (S320), forming transmission portions (S330), forming a preliminary light blocking portion (S340), and forming light blocking portion (S350). As described above, the light control layer LCR is provided between the optical layer POL and the display panels DP and DP-a or between the optical layer POL and the window WM.

Figure 11:
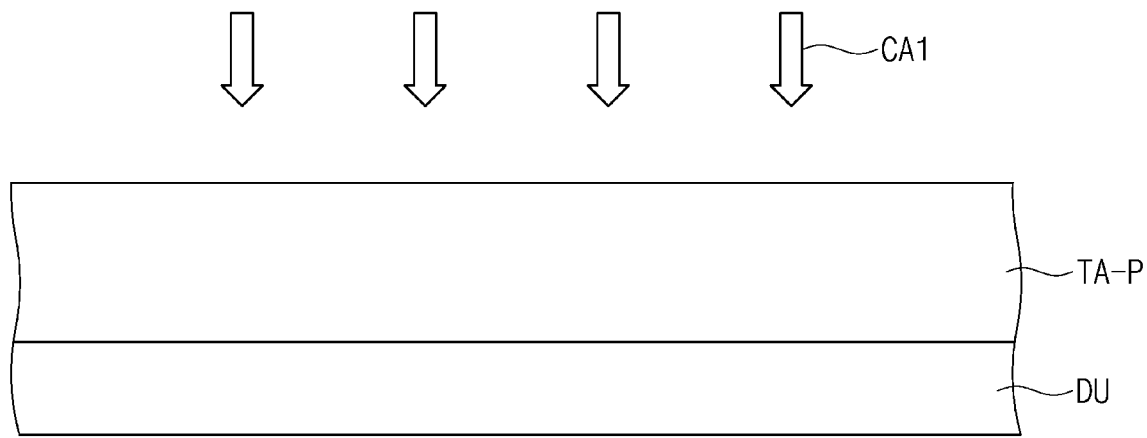
FIG. 11 is a cross-sectional view that illustrates a step of a method of manufacturing a display device according to an exemplary embodiment of the present disclosure.
Figure 11:
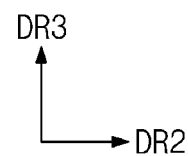
Figure 12:
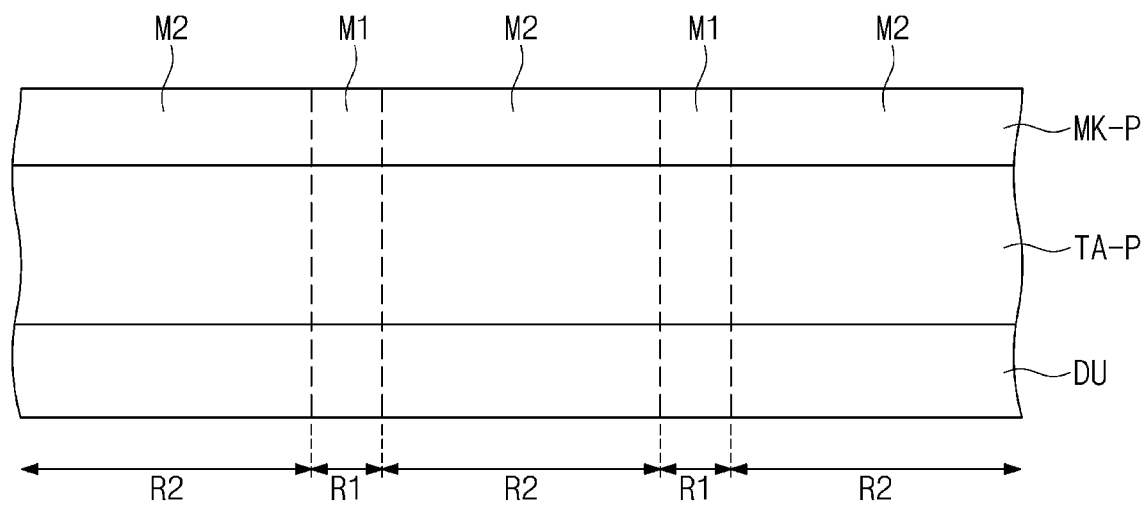
FIG. 12 is a cross-sectional view that illustrates a step of a method of manufacturing a display device according to an exemplary embodiment of the present disclosure.
Figure 12:
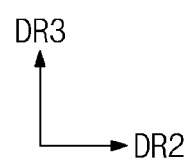

According to an embodiment, FIGS. 11 and 12 show the coating of an inorganic material MK-P on a preliminary transmission portion TA-P (S310). The preliminary transmission portion TA-P includes an organic material that is optically transparent. The preliminary transmission portion TA-P is formed by coating the organic material on a substrate DU. The substrate DU may be the above-described input sensing layer ISU or one of the auxiliary layers UL-a, UL-b, or UL-c. When the preliminary transmission portion TA-P is formed on the input sensing layer ISU, the preliminary transmission portion TA-P is formed through successive processes. The preliminary transmission portion TA-P is formed through successive processes after the input sensing layer ISU is formed on the display panel DP, as shown in FIG. 2.

Alternatively, according to an embodiment, when the preliminary transmission portion TA-P is formed on one of the auxiliary layers UL-a, UL-b, or UL-c, the preliminary transmission portion TA-P is formed through a separate process. A manufacturing process of the display panel DP-a and a manufacturing process of the light control layer LCR are performed separately from each other. The transmission portion TA is formed from the preliminary transmission portion TA-P, the light control layer LCR that includes the transmission portion TA is formed, and then the light control layer LCR and the display panel DP-a are coupled to each other. In addition, when the preliminary transmission portion TA-P is formed on the auxiliary layer UL-c, as shown in FIGS. 6 and 7, the preliminary transmission portion TA-P is formed on the auxiliary layer UL-c disposed on a glass substrate.

According to an embodiment, the inorganic material MK-P is coated by providing a material CA1 on the preliminary transmission portion TA-P. For example, the inorganic material may be one of ITO, $SnO_2$, ZnO, IZO, or $SiO_2$. However, these materials are merely exemplary, and the material used to coat the inorganic material MK-P should not be limited thereto. Any material that can perform a mask function can be used as a inorganic coating material of the present disclosure.

Figure 13:
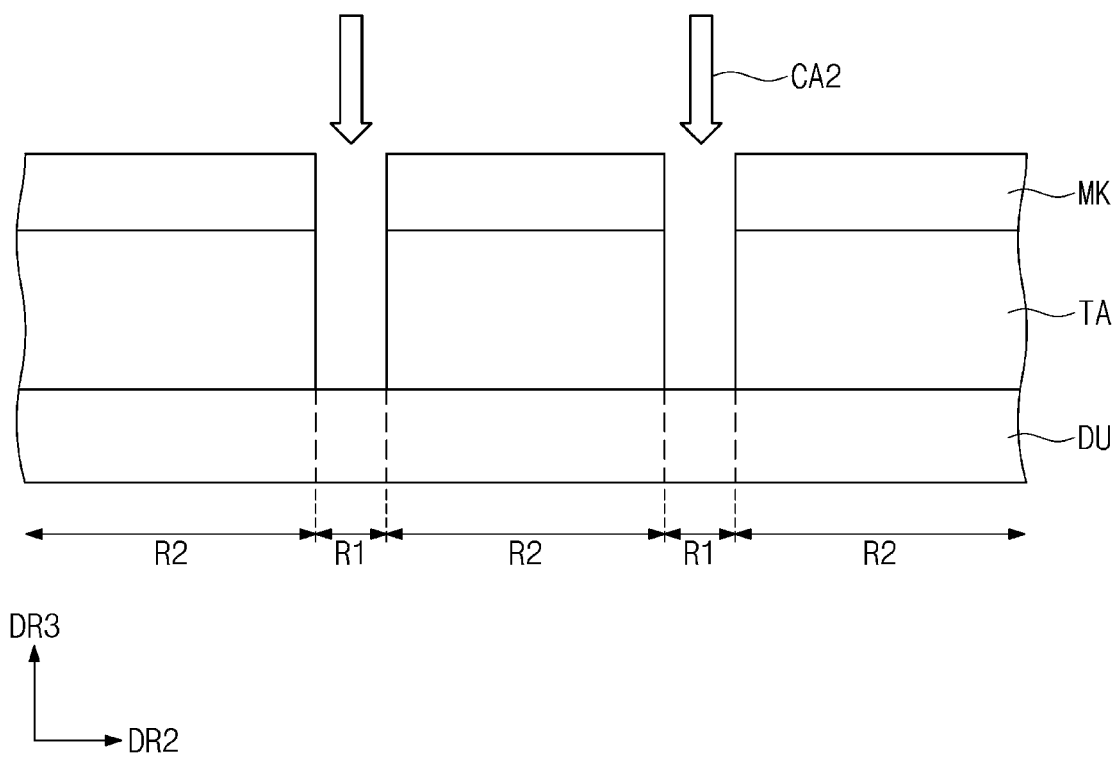
FIG. 13 is a cross-sectional view that illustrates a step of a method of manufacturing a display device according to an exemplary embodiment of the present disclosure.

Referring to FIGS. 12 and 13, according to an embodiment, a mask MK is formed on the preliminary transmission portion TA-P by coating the inorganic material MK-P and etching the coated inorganic material MK-P (S320). The mask MK is formed to include a first portion M1 that transmits a portion of the light and blocks the other portion of the light and a second portion M2 that blocks all lights propagating thereto. Each of the substrate DU and the preliminary transmission portion TA-P are divided into a first region R1 that corresponds to the first portion M1 and a second region R2 that corresponds to the second portion M2.

According to an embodiment, the preliminary transmission portion TA-P is etched to form the transmission portion TA (S330). The process of etching the preliminary transmission portion TA-P includes a dry etching process. When the preliminary transmission portion TA-P is etched using the mask MK, the second region R2, into which light is blocked by the mask MK, remains as shown in FIG. 13. The remaining second regions R2 correspond to the transmission portion TA. In the descriptions of FIGS. 12 and 13, a positive photoresist is used so that the photoresist of the exposed portion is removed is described as an example, however, exemplary embodiments are not limited thereto. According to another exemplary embodiment, a negative photoresist in which the photoresist of the unexposed portion is removed is used when forming the transmission portion TA.

According to an exemplary embodiment, the thickness T0 of the transmission portion TA and the width S0 of the transmission portion TA, shown in FIG. 2, are formed to satisfy Equation 1. The transmission portion TA is formed so that the thickness T0 is determined from the width S0 of the transmission portion TA by Equation 1, when the refractive index n of the transmission portion TA and the exit angle θ of the light of Equation 1 are set.

Figure 14:
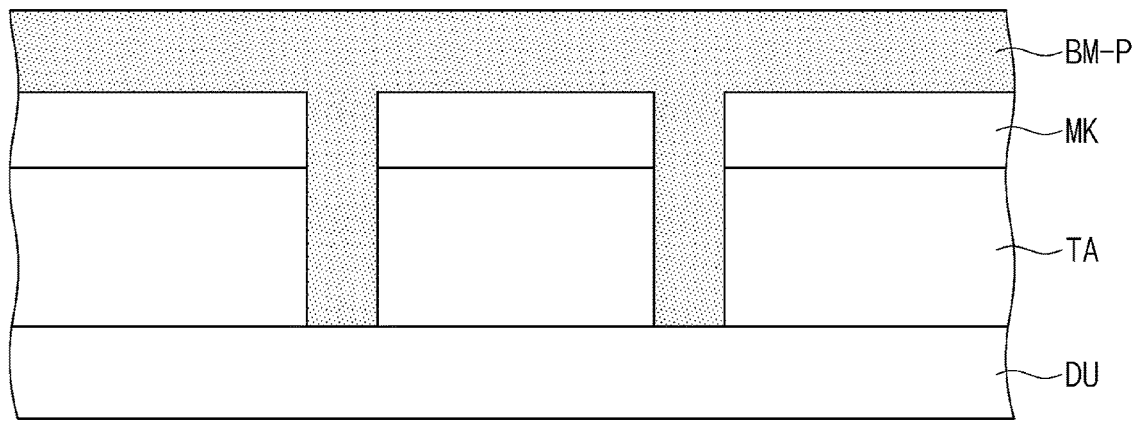
FIG. 14 is a cross-sectional view that illustrates a step of a method of manufacturing a display device according to an exemplary embodiment of the present disclosure.
Figure 14:
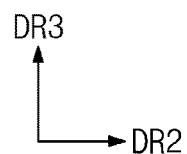
Figure 15:
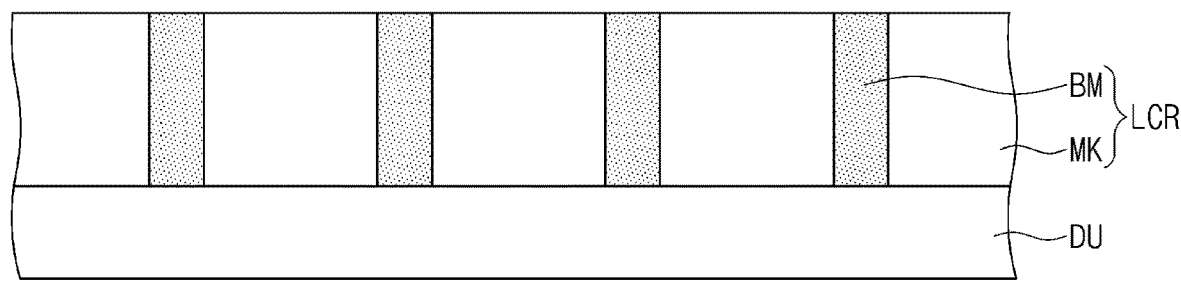
FIG. 15 is a cross-sectional view that illustrates a step of a method of manufacturing a display device according to an exemplary embodiment of the present disclosure.
Figure 15:
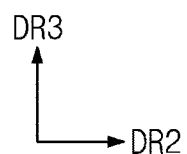

Then, referring to FIGS. 13 and 14, according to an embodiment, a material CA2 is provided to form the preliminary light blocking portion BM-P on the transmission portions TA (S340). For example, the material CA2 used to form the preliminary light blocking portion BM-P includes black carbon. The preliminary light blocking portion BM-P covers one surface of the mask MK and fills the spaces between the transmission portions TA. After the preliminary light blocking portion BM-P is formed, a process to remove the mask MK is performed, and the light blocking portion BM is formed (S350), as shown in FIG. 15. The process of removing the mask MK includes a dry etching process. However, this is merely exemplary, and in other embodiments, a process of removing the mask MK is not limited thereto.

On the other hand, according to an embodiment, as described above, when the preliminary transmission portion TA-P is formed on the auxiliary layer UL-c disposed on a glass substrate, as shown in FIGS. 6 and 7, a carrier film is attached to the light control layer LCR after the mask MK is removed. The carrier film is removed before the light control layer LCR is attached to the display panel DP-a.

According to an embodiment, the auxiliary layer UL-c and the light control layer LCR to which the carrier film is attached are detached from the glass substrate, and the film layer COP, shown in FIG. 6, is formed under the auxiliary layer UL-c. The film layer COP is coupled to the auxiliary layer UL-c by the auxiliary adhesive layer AL-c. Alternatively, the auxiliary adhesive layer AL-c and the film layer COP are omitted from the display device DD-d manufactured by a manufacturing method of a display device according to an exemplary embodiment of the present disclosure, as shown in FIG. 7.

A manufacturing method of a display device according to an exemplary embodiment includes forming a light control layer. The process of forming the light control layer includes forming the transmission portion from the preliminary transmission portion and forming the light blocking portion from the preliminary light blocking portion, and a width and thickness of the transmission portion satisfy Equation 1. Accordingly, a width of a light blocking portion of a light control layer, which is determined by the width and the thickness of the transmission portion, decreases. A display device manufactured by a manufacturing method according to an exemplary embodiment has improved light transmittance since the width of the light blocking portion has decreased.

Figure 16A:
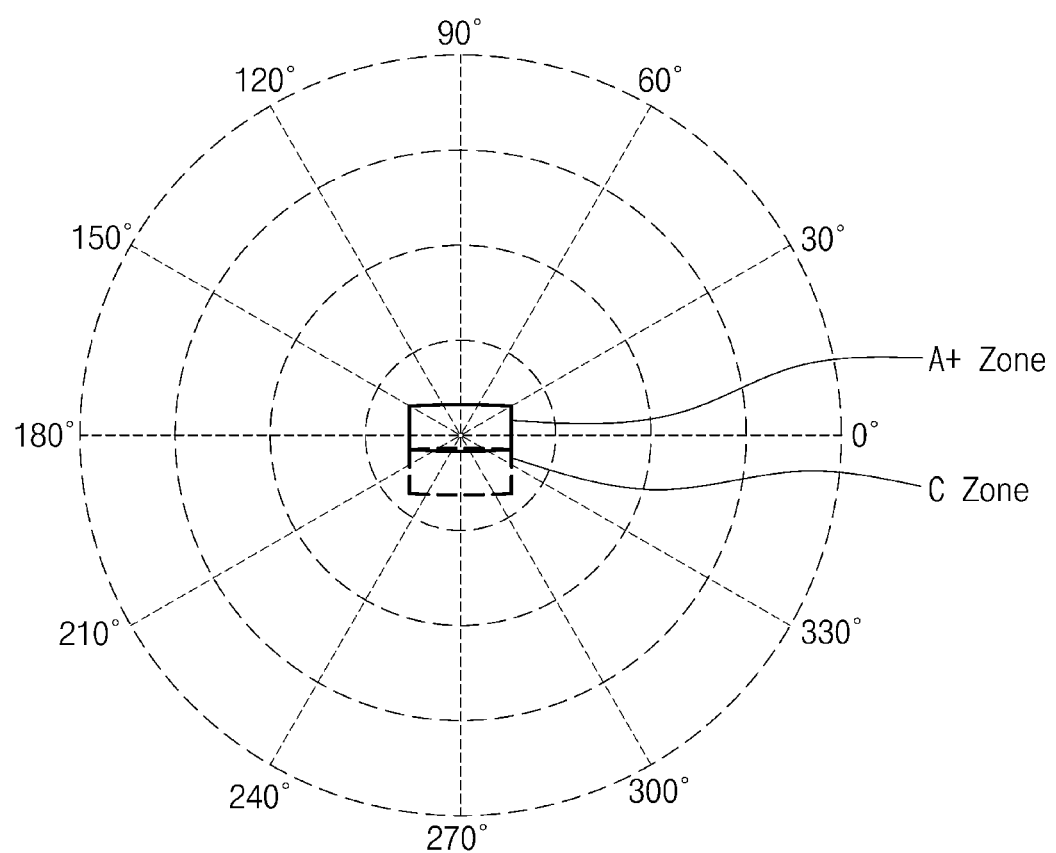
FIG. 16A is a graph of a zone in which a transmittance of a light is measured.
Figure 16A:
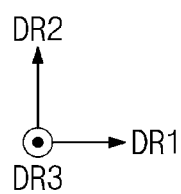
Figure 16B:
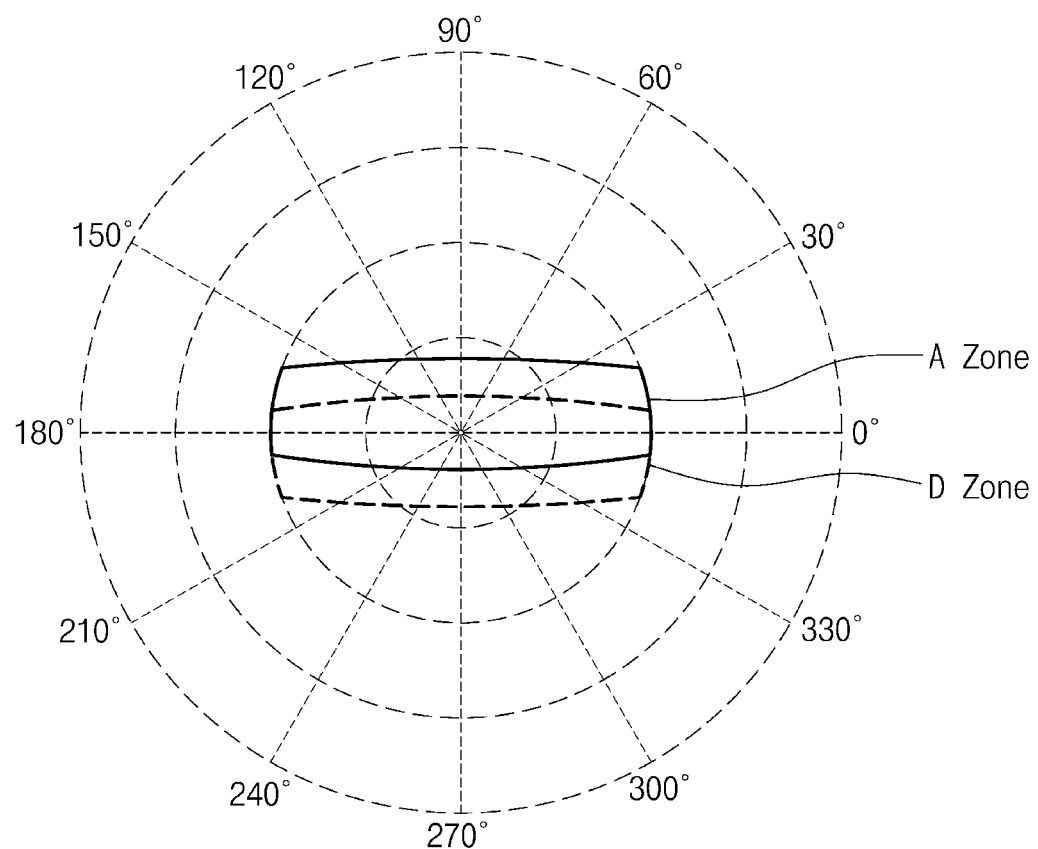
FIG. 16B is a graph of a zone in which a transmittance of a light is measured.
Figure 16C:
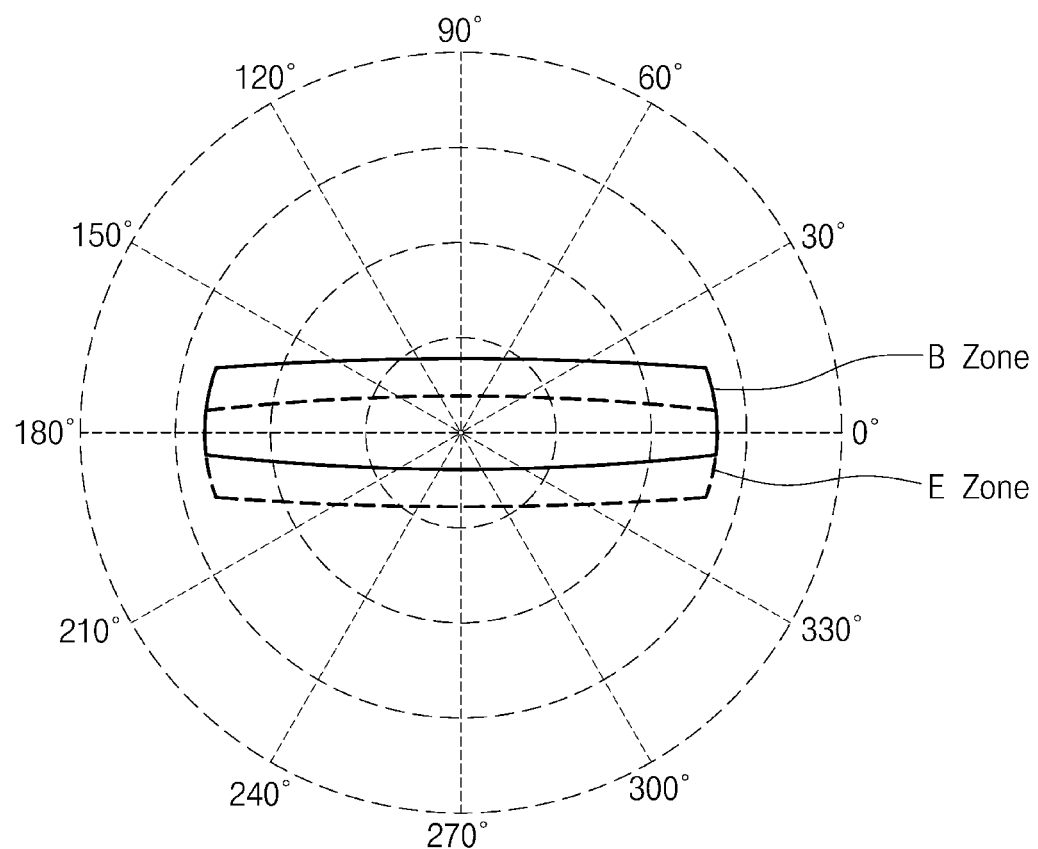
FIG. 16C is a graph of a zone in which a transmittance of a light is measured.

FIGS. 16A to 16C are graphs of zones in which light transmittance is measured. The zones shown in FIGS. 16A to 16C will be described with reference to an x, y, z coordinate system. The first directional axis DR1 corresponds to an x axis, the second directional axis DR2 corresponds to a y axis, a third directional axis DR3 corresponds to a z axis, and the third directional axis DR3 is substantially perpendicular to a plane defined by the first directional axis DR1 and the second directional axis DR2.

As shown in FIG. 16A, according to an embodiment, in an A+ zone, a z-axis coordinate is from about −4° to about 8°, an x-axis coordinate is about −10°, and a y-axis coordinate is about 10°. In a C zone, the z-axis coordinate is from about −2° to about −14°, the x-axis coordinate is about −10°, and a y-axis coordinate is about 10°. As shown in FIG. 16B, in an A zone, the z-axis coordinate is from about −10° to about 20°, the x-axis coordinate is about −40°, and the y-axis coordinate is about 40°. In a D zone, the z-axis coordinate is from about 10° to about −20°, the x-axis coordinate is about −40°, and the y-axis coordinate is about 40°. As shown in FIG. 16C, in a B zone, the z-axis coordinate is from about 20° to about −10°, the x-axis coordinate is about −50°, and the y-axis coordinate is about 50°. In an E zone, the z-axis coordinate is from about 10° to about −20°, the x-axis coordinate is about −50°, and the y-axis coordinate is about 50°.

The angle can be an angle from each of the axes. For example, when the coordinates of the z-axis are −5° to 5°, in a space including the z-axis, an angle between a straight line extending from the origin and the z-axis may be −5° to 5°. More specifically, in a plane defined by the z-axis and x-axis or a plane defined by the z-axis and y-axis, the angle between the z-axis and a straight line extending in the negative and positive directions from the origin may be −5° to 5°. In addition, when the angle of the x-axis is −5°, the angle formed by the x-axis and the straight line extending from the origin to the negative direction of the x-axis on a plane defined by the x-axis and the y-axis may be 5°. When the angle of the y-axis is 5°, the angle formed by the y-axis and the straight line extending from the origin to the positive direction of the y-axis on a plane defined by the x-axis and the y-axis may be 5°.

According to an embodiment, Table 1, below, shows the light transmittance in the A+ zone and each of the A to the E zones. The light transmittance measured in the zones shown in FIGS. 16A to 16C is shown in Table 1. Embodiment 1 shows the light transmittance when the width W0 of the light blocking portion BM is about 1 um. Embodiment 2 shows the light transmittance when the width W0 of the light blocking portion BM is about 1.5 um. Embodiment 3 shows the light transmittance when the width W0 of the light blocking portion BM is about 2 um. In Embodiments 1 to 3, the thickness T0 of the transmission portion TA is about 15 um. "Front" indicates the light transmittance measured at a center of the display device. "A+, C" indicates the same light transmittance measured in the A+ zone and the C zone. "A, D" indicates the same light transmittance measured in the A zone and the D zone. In addition, "B, E" indicates the same light transmittance measured in the B zone and the E zone.

TABLE 1

|  | Front | A+ | A+, C | A, D | B, E |
|---|---|---|---|---|---|
| Embodiment 1 | 86.5 | 70.0 | 66.6 | 49.3 | 54.3 |
| Embodiment 2 | 81.5 | 65.9 | 62.7 | 46.4 | 51.1 |
| Embodiment 3 | 77.0 | 62.2 | 59.2 | 43.8 | 48.3 |

Referring to Table 1, the light transmittance of Embodiment 2 is greater than that of Embodiment 3. In addition, the light transmittance of Embodiment 1 is greater than that of Embodiment 2. When comparing the light transmittances of Embodiments 1 to 3 with each other, the light transmittance increases as the width of the light blocking portion decreases. Accordingly, a display device that includes a light control layer according to an exemplary embodiment has improved light transmittance.

Figure 17:
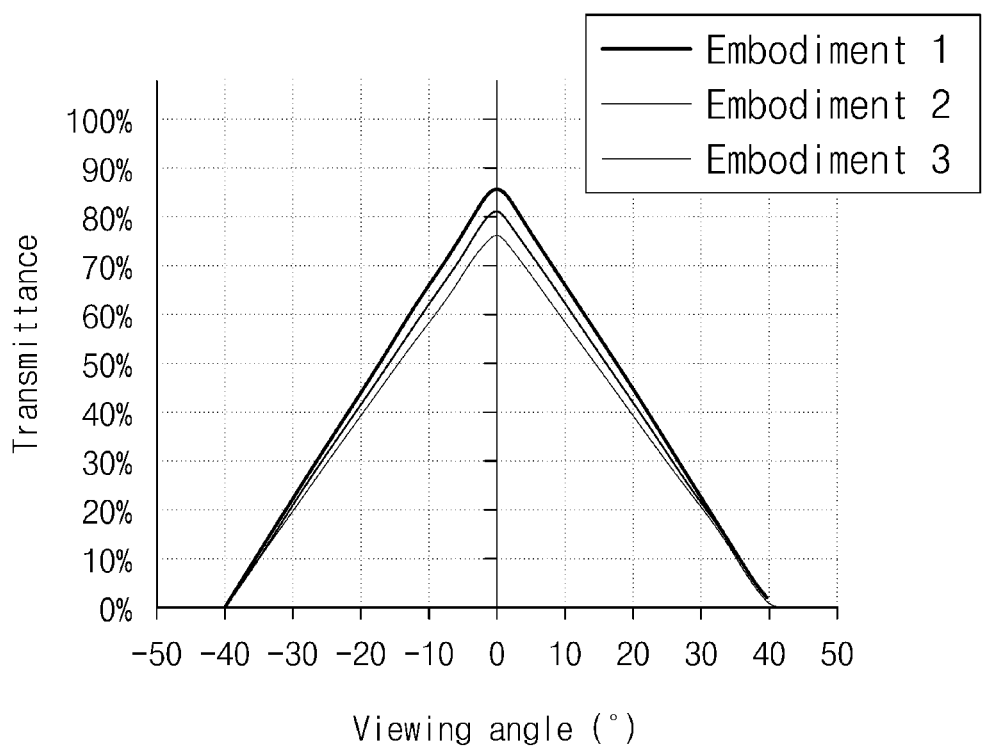
FIG. 17 is a graph of a transmittance of a light as a function of a viewing angle.

FIG. 17 is a graph of light transmittance as a function of a viewing angle. FIG. 17 shows the light transmittance of a display device that includes a light control layer according to an exemplary embodiment. The transmittance at a viewing angle of 0° corresponds to the light transmittance at the front of the display device, and an increase in the absolute viewing angle corresponds to moving a point at which the transmittance is measured from the front of the display device to a side of the display device. The graph shown in FIG. 17 shows the light transmittance measured while the point at which the transmittance is measured moves from the front of the display device to the side of the display device.

Referring to FIG. 17, in the display devices of Embodiments 1 to 3, the light transmittance improves as the width of the light blocking portion BM decreases. In addition, each graph of Embodiments 1 to 3 is bilaterally symmetric with respect to a viewing angle of 0°. As shown by the graphs of Embodiments 1 to 3, when the absolute viewing angles are the same as each other, the light transmittances are the same as each other. Accordingly, display devices of Embodiments 1 to 3 have the same light transmittance at positions symmetric with each other with respect to the front of the display device, i.e., a viewing angle of 0°. A display device according to an exemplary embodiment include a display panel, an optical layer, and a window, which are sequentially stacked, and may include a light control layer disposed between the display panel and the optical layer, or between the optical layer and the window. The light control layer includes a transmission portion that transmits light and a light blocking portion that absorbs light. The light blocking portion of the light control layer has a decreased width, and thus, the light control layer has improved light transmittance. A display device that includes the light control layer has improved light transmittance.

According to an embodiment, a manufacturing method of a display device includes forming the light control layer, and forming the light control layer includes forming the transmission portion and the light blocking portion. The light blocking portion is formed through a photolithography process and an etching process so that a light blocking portion with decreased width is formed, a display device manufactured by a manufacturing method includes a light blocking portion with decreased width, and thus, light transmittance is improved.

Although exemplary embodiments of the present disclosure have been described, it is understood that embodiments of the present disclosure should not be limited to exemplary embodiments but various changes and modifications can be made by one ordinary skilled in the art within the spirit and scope of embodiments of the present disclosure as hereinafter claimed.

Therefore, the disclosed subject matter should not be limited to any exemplary embodiment described herein, and the scope of embodiments of the present inventive concept shall be determined according to the attached claims.

What is claimed is:

1. A display device, comprising:
a display panel;
an optical layer disposed on the display panel;
an input sensing layer disposed on the display panel;
a window disposed on the optical layer; and
a light control layer disposed between the display panel and the optical layer or between the optical layer and the window, wherein the light control layer comprises:
a plurality of transmission portions spaced apart from each other and light blocking portions disposed between the transmission portions, wherein a thickness (T0) of each of the transmission portions and a width (S0) of each of the transmission portions in a cross-section are determined by a function of $$\frac{T0}{S0} = \sqrt{\left(\frac{n}{\sin\theta}\right)^2 - 1},$$

wherein n is a refractive index of the transmission portions, and θ is an exit angle of light emitted from the display panel and propagating through the light control layer, where the thickness of the transmission portions is equal to a thickness of the light blocking portion, and an interface between each of the transmission portions spaced and each of the light blocking portions is perpendicular to an upper surface of the light control layer,
wherein the light control layer is disposed directly on the input sensing layer.

2. The display device of claim 1, wherein the refractive index of the transmission portions is equal to or greater than about 1.4 and equal to or less than about 1.7.

3. The display device of claim 1, wherein the exit angle is equal to or greater than about 30° and equal to or less than about 50°.

4. The display device of claim 1, wherein the display panel, the input sensing layer, the light control layer, the optical layer, and the window are sequentially stacked.

5. The display device of claim 4, further comprising a first adhesive layer disposed between the light control layer and the optical layer, wherein the light control layer and the optical layer are spaced apart from each other with the first adhesive layer interposed therebetween.

6. The display device of claim 1, further comprising an auxiliary layer disposed on or under the light control layer, wherein the auxiliary layer comprises a polyimide resin or a glass.

7. The display device of claim 6, further comprising a second adhesive layer disposed between the optical layer and the auxiliary layer, wherein the auxiliary layer and the optical layer are spaced apart from each other with the second adhesive layer interposed therebetween.

8. The display device of claim 6, wherein the light control layer is disposed between the display panel and the optical layer, the auxiliary layer comprises glass, and the glass is optically isotropic.

9. The display device of claim 6, wherein the light control layer is disposed between the optical layer and the window, the auxiliary layer comprises polyimide resin, and the polyimide resin is optically anisotropic.

10. The display device of claim 6, further comprising a film layer that includes a cyclo-olefin polymer, wherein the film layer, the auxiliary layer, and the light control layer are sequentially stacked.

11. The display device of claim 1, wherein the thickness in the cross-section of the transmission portions is greater than 0 um and equal to or less than about 30 um.

12. The display device of claim 1, wherein a width in the cross-section of the light blocking portion is greater than 0 um and equal to or less than about 2 um.

13. The display device of claim 1, wherein the display panel is one of an organic light emitting display panel or a quantum dot light emitting display panel.

14. A display device, comprising:
a display panel;
an input sensing layer disposed on the display panel; and
a light control layer disposed on the display panel,
wherein the light control layer comprises:
 a plurality of transmission portions spaced apart from each other and light blocking portions between the transmission portions,
 wherein the thickness (T0) of each of the transmission portions and the width (S0) of each of the transmission portions in a cross-section satisfy $$\frac{T0}{S0} = \sqrt{\left(\frac{n}{\sin\theta}\right)^2 - 1},$$

wherein n is the refractive index of the transmission portions, and θ is the exit angle of light emitted from the display panel and propagating through the light control layer,
wherein the refractive index of the transmission portions is equal to or greater than about 1.4 and equal to or less than about 1.7, and the exit angle is equal to or greater than about 30° and equal to or less than about 50°,
where the thickness of the transmission portions is equal to a thickness of the light blocking portion, and an interface between each of the transmission portions spaced and each of the light blocking portions is perpendicular to a surface of an upper surface of the light control layer,
wherein the light control layer is disposed directly on the input sensing layer.

15. The display device of claim 14, further comprising:
an optical layer disposed on the light control layer; and
a window disposed on the optical layer.

16. The display device of claim 14, further comprising:
an optical layer disposed between the display panel and the light control layer; and
a window disposed on the light control layer, opposite from the optical layer.

* * * * *